(12) United States Patent
Schafer (10) Patent No.: US 9,489,998 B1
(45) Date of Patent: Nov. 8, 2016

(54) MAGNETIC JUNCTIONS HAVING A MAGNETOELASTIC FREE LAYER PROGRAMMABLE USING SPIN TRANSFER TORQUE

(71) Applicant: Samsung Electronics Co., LTD., Gyeonggi-do (KR)

(72) Inventor: Sebastian Schafer, San Jose, CA (US)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 15/003,360

(22) Filed: Jan. 21, 2016

Related U.S. Application Data (60) Provisional application No. 62/256,433, filed on Nov. 17, 2015.

(51) Int. Cl.
| | |
|---|---|
| G11C 11/00 | (2006.01) |
| G11C 11/16 | (2006.01) |
| H01L 43/02 | (2006.01) |
| H01L 43/08 | (2006.01) |
| H01L 43/10 | (2006.01) |
| H01L 27/22 | (2006.01) |

(52) U.S. Cl.
CPC .......... *G11C 11/161* (2013.01); *G11C 11/1675* (2013.01); *H01L 27/222* (2013.01); *H01L 43/02* (2013.01); *H01L 43/08* (2013.01); *H01L 43/10* (2013.01)

(58) Field of Classification Search
CPC ............. G11C 11/161; G11C 11/1675; H01L 27/222; H01L 43/02; H01L 43/08; H01L 43/10

USPC ....... 365/158, 46, 55, 74, 97, 100, 131, 148, 365/171, 173, 163
See application file for complete search history.

(56) References Cited

U.S. PATENT DOCUMENTS

| | | | |
|---|---|---|---|
| 7,282,755 B2 | 10/2007 | Pakala | |
| 7,808,027 B2 | 10/2010 | Horng | |
| 8,497,559 B2 | 7/2013 | Min | |
| 8,503,126 B2 | 8/2013 | Hsia | |
| 8,704,319 B2* | 4/2014 | Tang | H01L 43/08 257/421 |
| 2013/0126996 A1 | 5/2013 | Jeong | |
| 2015/0001654 A1 | 1/2015 | Sandhu | |

FOREIGN PATENT DOCUMENTS

WO 2013020569 2/2013

* cited by examiner

*Primary Examiner* — Fernando Hidalgo
(74) *Attorney, Agent, or Firm* — Convergent Law Group LLP (57) ABSTRACT

A magnetic junction and method and programming the magnetic junction are described. The magnetic junction has a free layer, a reference layer, and a nonmagnetic spacer layer between reference and free layers. The free layer is switchable between stable magnetic states when a write current is passed through the magnetic junction. The free layer has a perpendicular magnetic anisotropy exceeding its out-of-plane demagnetization energy a quiescent state. The free layer has a magnetostriction such that the perpendicular magnetic anisotropy changes in the presence of a programming voltage applied for the magnetic junction, canting that the magnetic moment by at least five degrees from its quiescent direction. The programming voltage is at least 0.1 volt and not more than 2 volts. The nonmagnetic spacer layer is an insulating tunneling barrier layer and/or the magnetic junction includes an additional insulating layer adjacent to the opposite interface of the free layer.

18 Claims, 6 Drawing Sheets

Time ≤ $t_1$
FIG. 7

Time ≥ $t_4$
FIG. 9

MAGNETIC JUNCTIONS HAVING A MAGNETOELASTIC FREE LAYER PROGRAMMABLE USING SPIN TRANSFER TORQUE

CROSS-REFERENCE TO RELATED APPLICATIONS

This application claims the benefit of provisional Patent Application Ser. No. 62/256,433, filed Nov. 17, 2015, entitled MAGNETOELASTIC FL ASSIST FOR FAST STT SWITCHING, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The conventional MTJ, uses conventional seed layer(s), may include capping layers and may include a conventional antiferromagnetic (AFM) layer. The conventional MTJ includes a conventional pinned layer, a conventional free layer and a conventional tunneling barrier layer between the conventional pinned and free layers. A bottom contact below the conventional MTJ and a top contact on the conventional MTJ may be used to drive current through the conventional MTJ in a current-perpendicular-to-plane (CPP) direction.

The conventional pinned layer and the conventional free layer are magnetic. The magnetization of the conventional pinned layer is fixed, or pinned, in a particular direction. The conventional free layer has a changeable magnetization. The conventional free layer may be a single layer or include multiple layers. The pinned layer and free layer may have their magnetizations oriented perpendicular to the plane of the layers (perpendicular-to-plane) or in the plane of the layers (in-plane).

To switch the magnetization of the conventional free layer, a current is driven perpendicular to plane. When a sufficient current is driven from the top contact to the bottom contact, the magnetization of the conventional free layer may switch to be parallel to the magnetization of a conventional bottom pinned layer. When a sufficient current is driven from the bottom contact to the top contact, the magnetization of the free layer may switch to be antiparallel to that of the bottom pinned layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. Mechanisms for improving the performance of STT-RAM are desired. For example, a high perpendicular magnetic anisotropy and a high magnetoresistance are desired. A high magnetic anisotropy in the conventional free layer allows the magnetic moment of the free layer to be thermally stable at higher temperatures. However, a high magnetic anisotropy also results in an increase in the current required to switch the direction of magnetization of the free layer, particularly for shorter current pulse widths. Such an increase is undesirable. Shorter write times, and thus shorter current pulses, are also desired for faster memories. Thus, the use of a high magnetic anisotropy suffers from multiple drawbacks. Accordingly, what is needed is a method and system that may improve the performance of the spin transfer torque based memories. The method and system described herein address such a need.

BRIEF SUMMARY OF THE INVENTION

A magnetic memory and methods for providing and programming the magnetic memory are described. The memory includes storage cells and bit lines. Each storage cell includes magnetic junction(s) having a free layer, a reference layer, and a nonmagnetic spacer layer between reference and free layers. The free layer is switchable between stable magnetic states when a write current is passed through the magnetic junction. The free layer has a magnetic moment, a perpendicular magnetic anisotropy and an out-of-plane demagnetization energy. The perpendicular magnetic anisotropy exceeds the out-of-plane demagnetization energy for a quiescent state. The magnetic moment is along a direction in the quiescent state. The free layer has a magnetostriction such that the perpendicular magnetic anisotropy changes so that the magnetic moment is canted by at least five degrees from the direction in the presence of a programming voltage applied for the magnetic junction. The programming voltage is at least 0.1 volts and not more than 2 volts. The free layer has a first interface facing the nonmagnetic spacer layer and a second interface opposite to the nonmagnetic spacer layer. At least one of the nonmagnetic spacer layers is an insulating tunneling barrier layer adjacent to the first interface and the magnetic junction further includes an additional insulating layer adjacent to the second interface.

DETAILED DESCRIPTION OF THE INVENTION

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps, substeps and/or steps in different orders that are not inconsistent with the exemplary embodiments. Thus, the present invention is not intended to be limited to the embodiments shown, but is to be accorded the widest scope consistent with the principles and features described herein.

A magnetic memory and methods for providing and programming the magnetic memory are described. The memory includes storage cells, magnetic oscillator(s) and bit lines. Each storage cell includes magnetic junction(s) having a free layer, a reference layer, and a nonmagnetic spacer layer between reference and free layers. The free layer is switchable between stable magnetic states when a write current is passed through the magnetic junction. The free layer has a magnetic moment, a perpendicular magnetic anisotropy and an out-of-plane demagnetization energy. The perpendicular magnetic anisotropy exceeds the out-of-plane demagnetization energy for a quiescent state. The magnetic moment is along a direction in the quiescent state. The free layer has a magnetostriction such that the perpendicular magnetic anisotropy changes so that the magnetic moment is canted by at least five degrees from the direction in the presence of a programming voltage applied for the magnetic junction. The programming voltage is at least 0.1 volts and not more than 2 volts. The free layer has a first interface facing the nonmagnetic spacer layer and a second interface opposite to the nonmagnetic spacer layer. At least one of the nonmagnetic spacer layer is an insulating tunneling barrier layer adjacent to the first interface and the magnetic junction further includes an additional insulating layer adjacent to the second interface.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 1:
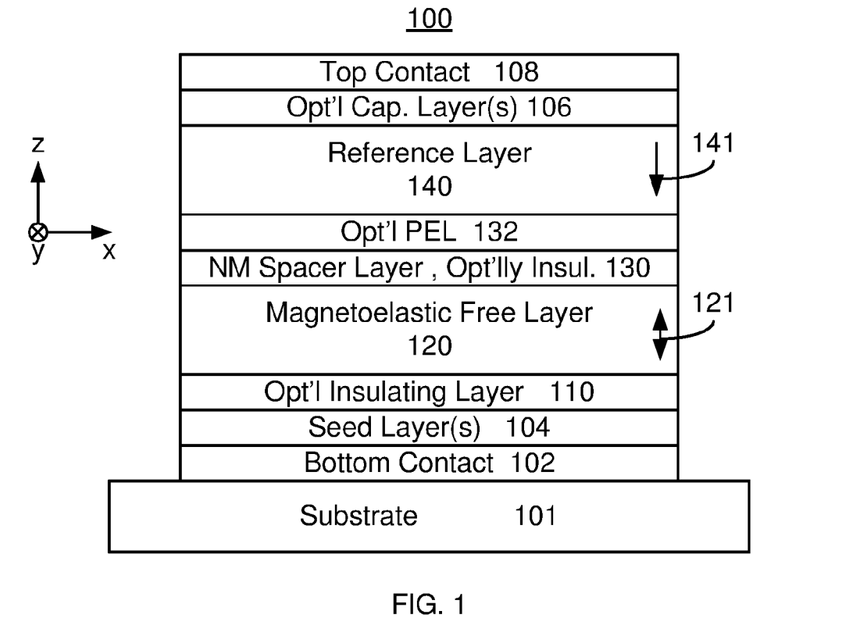
FIG. 1 depicts an exemplary embodiment of a magnetic device including magnetic junctions programmable using spin transfer and the magnetoelastic effect.

FIG. 1 depicts an exemplary embodiment of a magnetic junction 100 including usable in a magnetic memory and programmable using spin transfer torque and the magnetoelastic effect. For clarity, FIG. 1 is not to scale. The magnetic junction 100 may be used in a magnetic device such as a STT-RAM and, therefore, in a variety of electronic devices.

The magnetic junction 100 includes an optional insulating layer 110, a free layer 120 having magnetic moment 121, a nonmagnetic spacer layer 130 and a reference layer 140 having magnetic moment 141. Also shown is an underlying substrate 101 in which devices including but not limited to a transistor may be formed. The magnetic junction may 100 also include optional polarization enhancement layer (PEL) 132 has a high spin polarization. For example, the PEL 132 might include Fe and/or CoFe. Bottom contact 102, top contact 108, optional seed layer(s) 104 and optional capping layer(s) 106 are also shown. For example, the seed layer(s) 104 may include a thin MgO seed layer. In the embodiment shown, the reference layer 140 is further from the substrate than the layer 120. The magnetic junction 100 is, therefore, a top pinned junction. Although the layers 110, 120, 130, 132 and 140 are shown with a particular relationship to the substrate 101, in other embodiments, the order may differ. For example, in another embodiment, from closest to furthest from the substrate 101, the layers may be 140, 132 (if present), 130, 120 and 110. Thus the magnetic junction 100 may be a bottom pinned magnetic junction. In alternate embodiments, the magnetic junction 100 could be a dual magnetic junction that includes an additional pinned layer and a nonmagnetic spacer layer between the free layer 120 and the additional pinned layer (not shown).

An optional pinning layer (not shown) may be used to fix the magnetization (not shown) of the reference layer 140. The optional pinning layer may be an AFM layer or multilayer that pins the magnetization (not shown) of the reference layer 140 by an exchange-bias interaction. However, in other embodiments, the optional pinning layer may be omitted or another structure may be used.

Other layers including but not limited to other PELs having a high spin polarization, magnetic or nonmagnetic insertion layers, and/or other layers may be included in the layers of the magnetic junction 100 or be considered to be separate layers that may be used in the magnetic junction 100. However, only one such layer 132 is shown for simplicity. The magnetic junction 100 is configured such that the free layer is switchable between a plurality of stable magnetic states using a write current is passed through the magnetic junction 100. Thus, the free layer 120 is programmable using spin transfer torque.

The nonmagnetic spacer layer 130 is between reference layer 140 and the free layer 120. The nonmagnetic spacer layer 130 may be an MgO tunneling barrier layer. The MgO layer may be crystalline and have a 200 orientation for enhanced tunneling magnetoresistance (TMR). In other embodiments, the nonmagnetic spacer layer 130 may be a different tunneling barrier layer, may be a conductive layer or may have another structure.

The reference layer 140 is magnetic. The reference layer 140 may be part of a pinned structure, such as a SAF. In such embodiments, the reference layer 140 would be one of the ferromagnetic layers interleaved with nonmagnetic layer(s). The reference layer 140 may be a multilayer. Thus, the reference layer 140 layer may also include sublayers including but not limited to multiple ferromagnetic layers. The PEL 132 having a high spin polarization is provided at the portion of the reference layer 140 nearest to the nonmagnetic spacer layer 130. In other embodiments, the PEL 132 may be omitted.

The perpendicular magnetic anisotropy (PMA) energy of the reference layer 140 exceeds its out-of-plane demagnetization energy in the embodiment shown. The reference layer 140 thus has a high PMA. As used herein a high PMA is a PMA such that the PMA energy is greater than the out-of-plane demagnetization energy. Because the reference layer 140 has a high PMA, the magnetic moment 141 of the reference layer 140 may be perpendicular-to-plane (along the z-direction as shown-in the direction shown in FIG. 1 or antiparallel to the direction shown in FIG. 1). In such embodiments, a pinning layer is generally not used. For example, the reference layer 140 may include a multilayer including multiple repeats of a Co/Pt bilayer, a CoPt alloy, a CoTb alloy and/or multiple repeats of a Co/Tb bilayer. Such combinations may have a high PMA. Similarly, the reference layer 140 may include one or more of CoFeB, FeB, CoB, Fe, Co$_2$FeAl, Co$_2$FeAlSi, Co$_2$MnSi and MnAl, which may have a high PMA. Note that as used herein CoFeB, FeB, CoB and MnAl denote alloys in which the stoichiometry is not indicated. For example, CoFeB may include $(CoFe)_{1-x}B_x$, where x is greater than or equal to zero and less than or equal to 0.5. For example, x may be at least 0.2 and not more than 0.4. Similarly, FeB may be $Fe_{1-x}B_x$, where x is greater than or equal to zero and less than or equal to 0.5. Other materials and/or structures are having a high PMA possible for the reference layer 140. In other embodiments, the magnetic moment 141 of the reference layer 140 may be in-plane.

The free layer 120 is magnetic and has a PMA energy that exceeds the out-of-plane demagnetization energy when the magnetic junction 100 is in the quiescent state. In other words, when no write current or voltage is applied to the magnetic junction 100, the PMA energy is greater than the out-of-plane demagnetization energy. The free layer 120 thus has a high PMA. Because of the relationship between the PMA and out-of-plane demagnetization energy, the magnetic moment 121 of the free layer 120 may be oriented perpendicular-to-plane as shown in FIG. 1 (in the + or −z direction). The magnetic junction is also configured such that the magnetic moment 121 of the free layer 120 may be switched using a write current driven through the magnetic junction (e.g. using spin transfer).

In addition, the free layer 120 is a magnetoelastic free layer. Stated differently, the free layer 120 has a magnetostriction. In the embodiments shown, only a single layer is shown for the free layer 120. However, the free layer 120 may include multiple layers. Thus, at least one layer in the free layer 120 has a sufficiently high magnetostriction that the free layer 120 operates as described below.

Because it has a sufficiently high magnetostriction (or magnetoelasticity), a change in the magnetic moment of the free layer 120 results in a change in the shape/size of the free layer 120. Similarly, a force on/change in shape of the free layer 120 results in a change in the magnetic properties of the layer 120. In other words, if the free layer 120 is subject to a stress or strain, the magnetic properties of the free layer 120 change. In particular, the PMA of the free layer 120 may decrease in response to a stress. For example, materials such as Co and Tb are magnetostrictive. One or both of these may be used in the free layer 120. In some embodiments, the free layer 120 includes $Tb_xDy_{1-x}Fe_2$ (Terfenol-D) where x is greater than zero and less than one. In some embodiments, x is nominally 0.2. Such materials have a high magnetostriction and may have a high PMA such that the free layer magnetic moment 121 is perpendicular to plane when not being written.

In the magnetic junction 100, at least one of the nonmagnetic spacer layer 130 is an insulating layer and the magnetic junction 100 includes the insulating layer 110. Thus, in some embodiments, the nonmagnetic spacer layer 130 is an insulating tunneling barrier layer such as a crystalline MgO layer and the insulating layer 110 is omitted. In such a case, the nonmagnetic spacer layer 130 may adjoin the top interface of the free layer 120. In other embodiments, the insulating layer 110 is present and the nonmagnetic spacer layer 130 is conductive. In such embodiments, the insulating layer 110 may be a crystalline MgO layer. The insulating layer 110 may adjoin the bottom interface of the free layer 120. In still other embodiments, the nonmagnetic spacer layer 130 is an insulating tunneling barrier layer and the insulating layer 110 is present. In such embodiments, the layers 110 and 130 may adjoin the interfaces of the free layer 120. In some embodiments, the insulating layer 110 may be considered to be part of or replace a crystalline MgO seed layer 104 that may enhance the PMA of the free layer 120. If the magnetic junction 100 is a bottom pinned magnetic junction and the layer 110 is included, then the insulating layer 110 may be considered to be part of or replace a crystalline capping layer 106 that may enhance the PMA of the free layer 120.

If the insulating layer 130 and/or 110 is adjacent to the free layer 120, then in the presence of a programming voltage used to drive a write current through the free layer 120 may generate a voltage difference across one of the insulating layers 110 or 130. If both layers 110 and 130 are present and insulating, then a potential may be created across both layers 110 and 130. The free layer 120 adjoins one of the insulators 110 or 130 or is between the two insulators 110 and 130. The magnetic junction 100 may be considered to include a capacitor. As a result, application of a programming voltage may result on a stress being placed on the free layer 120. As stated above, the free layer 102 has a magnetostriction. Because of this stress and the magnetostriction of the free layer 120, the magnetic properties of the free layer 120 change. More specifically, the PMA of the free layer 120 responds to the stress. In some embodiments, the PMA of the free layer 120 decreases in response to the stress. The saturation magnetization of the free layer 120 may also undergo a reduction analogous to that of the PMA. This decrease in PMA occurs regardless of the polarity of the programming voltage (i.e. whether current is driven in the +z or the −z direction). As used herein, a programming voltage is the voltage applied to the line coupled to the magnetic junction being programmed.

The reduction in the PMA of the free layer 120 due to magnetostriction and the applied voltage allows the moment 121 to be canted from the equilibrium direction shown in FIG. 1. Because of the magnitude of the magnetostriction of the free layer 120, the magnetic moment 121 is canted by at least five degrees from the direction for the programming voltage applied for the magnetic junction. The programming voltage is at least 0.1 volt and not more than 2 volts to obtain the angle of at least five degrees. Stated differently, the magnetostriction of the free layer 120 is sufficiently large that for a programming voltage of at least 0.1 volt and not more than 2 volts, the PMA of the free layer 120 changes enough for the magnetic moment 121 to be canted by at least five degrees from the z-axis. In some embodiments, the programming voltage is at least 0.5 volts and not more than 1 volt. In such embodiments, the magnetostriction of the free layer 120 is sufficiently large that for a programming voltage of at least 0.5 volt and not more than 1 volt, the PMA of the free layer 120 changes enough for the magnetic moment 121 to be canted by at least five degrees from the z-axis. In some embodiments, the change in PMA due to the pressure applied by the layer(s) 110 and/or 130 of the magnetic junction and the magnetostriction of the free layer 120 is sufficient that the magnetic moment 121 becomes in-plane. Thus, the PMA may reduce sufficiently that the PMA energy is less than the out-of-plane demagnetization energy.

In operation, the free layer 120 has a high PMA when not being programmed. Thus, the free layer 120 is magnetically stable during read operations and when the magnetic junction 110 is quiescent (not being read or programmed). In some such embodiments, the magnetic moment 121 of the free layer 120 is perpendicular-to-plane when the magnetic junction 100 is not being written (at equilibrium).

During writing, a programming voltage is applied for the magnetic junction 100. As a result, a write current is driven through the magnetic junction 100. The programming voltage also sets up the capacitive nature of the insulating layer(s) 110 and/or 130. These layer(s) 110 and/or 130 exert a force (e.g. a pressure) on the free layer 120. Stated differently, an internal stress is generated. This internal stress is due to layers within the magnetic junction 100 and through which the write current flows. This stress is dynamic in nature and, therefore, only present when a voltage is applied to the magnetic junction 100. Further, because the stress is due to layers 110 and/or 130 within the magnetic junction 100, the stress may not affect neighboring magnetic junctions (not shown) in a magnetic memory. Because of the magnetostriction of the free layer 120, the stress results in a change (e.g. a reduction) of the PMA of the free layer 120. This change in PMA may take place in the picosecond time scale. In some cases, the change in PMA may be in the sub-picosecond time scale. Consequently, the magnetic moment 121 of the free layer 120 is at least canted from its quiescent direction and may go in-plane. The saturation magnetization may be decreased in a manner analogous to the PMA. Because the magnetic moment 121 is canted from perpendicular-to-plane, the spin polarized write current driven through the magnetic junction 110 may more effectively switch the magnetic moment 121 to the desired direction via spin transfer torque. Thus, switching may occur more rapidly and at a lower write current. The magnetic junction 100 may then be more rapidly programmed using STT by the write current driven through the magnetic junction.

The magnetic junction 100 may have improved performance. The free layer 120 and reference layer 140 may have their magnetic moments oriented perpendicular-to-plane, which may be desirable for improved performance. Because of the high PMA, the free layer 120 is thermally stable at equilibrium, when the magnetic junction 100 is quiescent. When a programming voltage is applied to the magnetic junction 100, the magnetostriction of the free layer 120 may result in a drop in PMA and canting of the magnetic moment 121. Stated differently, the magnetic moment 121 is moved away from the stagnation point. The magnetic moment 121 may then have a component in-plane, perpendicular to the magnetic moment 141. Consequently, the spin polarized write current may more effectively and rapidly switch the magnetic moment 121. Switching time may be decreased. Consequently, performance of the magnetic junction 100 and a magnetic memory using the magnetic junction 100 may be improved.

Figure 2:
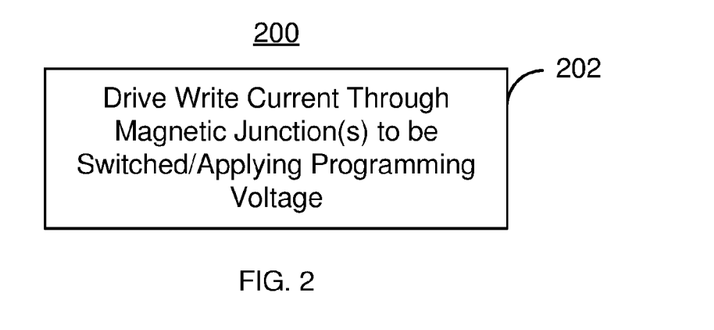
FIG. 2 is a flow chart depicting an exemplary embodiment of a method for programming a magnetic junction spin transfer torque and magnetoelastic effect.

FIG. 2 depicts an exemplary embodiment of a method 200 for programming a magnetic junction including a magnetoelastic free layer and usable in a magnetic device such as an STT-RAM and, therefore, in a variety of electronic devices. For simplicity, some steps may be omitted, performed in another order, include substeps and/or combined. Further, the method 200 may start after other steps in forming a magnetic memory have been performed. For simplicity, the method 200 is described in the context of the magnetic junction 100. However, other magnetic junctions and magnetic memories having analogous properties might be used.

A programming voltage is applied to the magnetic junction 100 and a write current driven through the magnetic junction 100, via step 202. Step 202 may include providing a programming voltage pulse. The write current may be due in whole or in part to the programming voltage applied. Thus, the write current is not continuously driven through the magnetic junction 110. In addition, the write current is only driven through those magnetic junctions desired to be programmed. In some embodiments, the programming voltage pulse has a width of not more than ten nanoseconds. In some embodiments, the programming voltage pulse has a width of not more than one nanosecond. However, other pulse widths are possible.

Thus, a programming voltage that results in a change in the PMA is applied to the magnetic junction 100. A write current is also driven through the magnetic junction 100 in the current perpendicular-to-plane (CPP) direction. Because of the change in PMA, the magnetic moment 121 of the free layer 121 may be moved away from the stagnation point. As a result, the write current may more efficiently and rapidly program the magnetic junction 100. Using the method 200, the magnetic junction 100 may be more rapidly and easily programmed.

The method 200 may be more fully explained in connection with FIGS. 3-9. FIGS. 3-6 depicts exemplary embodiments of timing diagrams for programming a magnetic junction 100 using spin transfer torque and a magnetoelastic free layer 120 in the method 200. FIGS. 7, 8A-8B and 9 depict another exemplary embodiment of the magnetic moment of the magnetoelastic free layer during programming using spin transfer torque. For simplicity, FIGS. 3-9 are described in the context of the method 200 and magnetic junction 100. However, the discussion herein applies to other analogous methods and magnetic memories. Note that the diagrams of FIGS. 3-9 are for explanation only and are not intended to depict a particular write mechanism or memory.

Figure 3:
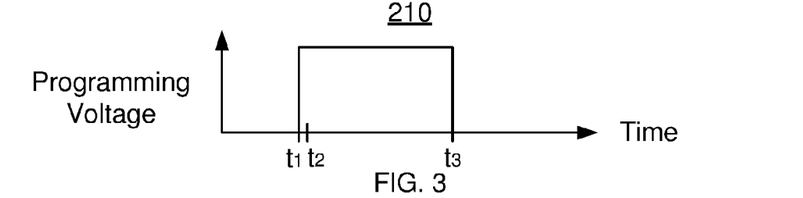
FIGS. 3-6 depict exemplary embodiments of timing diagrams for programming a magnetic junction using spin transfer torque and the magnetoelastic effect.

FIG. 3 is a graph 210 depicting the programming voltage through selected magnetic junction 100 as a function of time. Thus, the programming voltage is turned on at time $t_1$, via step 202. The programming voltage is rapidly ramped up, reaching a maximum at time $t_2$. The programming voltage remains constant for a time. The programming voltage is then rapidly ramped down, reaching zero at time $t_3$. In addition to a programming voltage being applied to the magnetic junction 100, a write current corresponding to the programming voltage pulse is driven through the magnetic junction 100. Although not shown, the write current and programming voltage may overshoot the desired value in addition to having a fast rise time.

Figure 4:
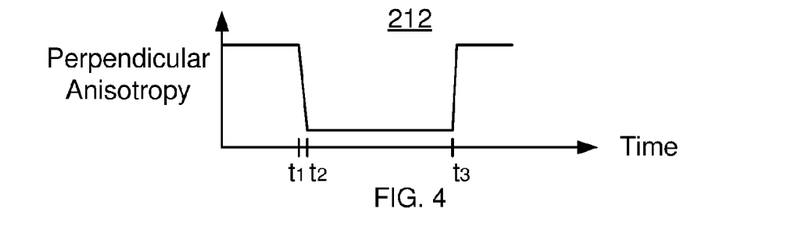

FIG. 4 is a graph 212 depicting the PMA for the free layer 120 as a function of time. The PMA of FIG. 4 is intended to illustrate general trends in the PMA during writing and does not represent data for a specific magnetic junction 100. The saturation magnetization follows similar trends. The free layer 120 is subject to a stress due to the programming voltage and insulating layer(s) 110 and/or 130. The stress is turned on at time $t_1$. The PMA of the free layer 120 decreases. The change in the stress on and PMA of the free layer 120 is rapid. Thus, at time $t_2$, the PMA may be at or close to the minimum value during writing. The PMA remains relatively low during writing because the free layer voltage is still applied. In addition, the spin polarized current is driven through the magnetic junction 100. When the programming voltage is turned off at time $t_3$, the PMA and saturation magnetization rapidly increase to their initial values.

Figure 5:
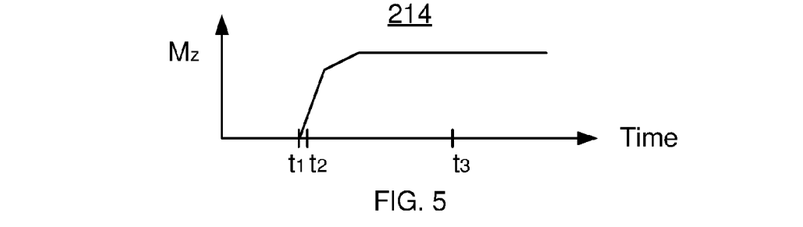

FIG. 5 is a graph 214 depicting changes in the magnetic moment in the desired direction along the z-axis during switching. After the initial reduction in PMA and the attendant decrease in saturation magnetization, the magnetic moment 121 may be switched using STT. This may occur rapidly because the reduction in PMA has moved the magnetic moment 121 away from the stagnation point. In some embodiments, the magnetic moments may be switched with acceptably small error rates in less than five nanoseconds. In some embodiments, such switching takes at least one nanosecond. However, other times are possible.

Figure 6:
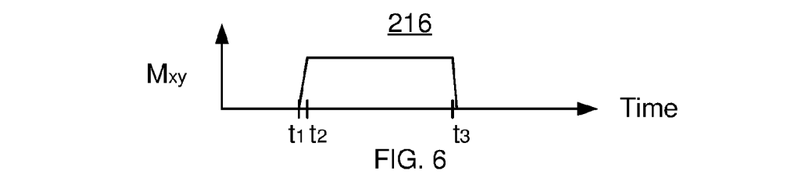

FIG. 6 is a graph 216 depicting the component of the magnetic moment 121 in the x-y plane (in-plane). Prior to switching, the magnetic moment 121 is substantially perpendicular-to-plane. Thus, the magnetic moment 121 in the x-y plane (Mxy) is near zero. The reduction in the PMA due to the applied programming voltage allows for a nonzero component of the magnetic moment 121 in the x-y plane. As can be seen in FIG. 6, this change in the magnetic moment may occur relatively rapidly. In some embodiments, Mxy becomes large. This occurs if the reduction in PMA allows the magnetic moment 121 to go in-plane or be canted at a very large angle from the z-axis. When the programming voltage is removed, the component of the magnetic moment 121 in the x-y plane rapidly decreases.

Figure 7:
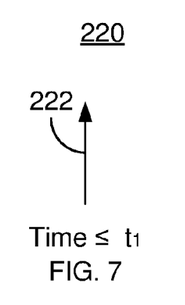
FIGS. 7, 8A-8B and 9 depict another exemplary embodiment of the magnetic moment of the free layer during programming using spin transfer torque and the magnetoelastic effect.

FIG. 7 depicts the magnetic moment 222 before writing commences and at the very start of the programming voltage 212 in step 202. The magnetic moment 222 is analogous to the magnetic moment 121 of FIG. 1. The magnetic moment 222 of the free layer 120 is aligned with the easy axis (e.g. the z-axis) of the free layer 120. Thermal fluctuations may allow for a small deviation in the magnetic moment 222 from the easy axis. However, the large free layer magnetic anisotropy results in smaller thermal deviations. Thus, the magnetic moment 222 is considered to be very well aligned with the easy axis (i.e. the z-axis).

Figure 8A:
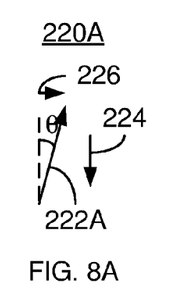
Figure 8B:
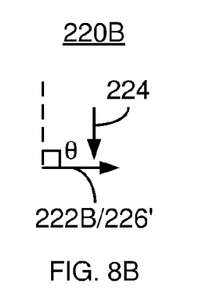

FIGS. 8A and 8B depict two possible embodiments of the magnetic moment 222 at some time after $t_2$ but before switching has occurred. The magnetic anisotropy has decreased because of magnetostriction and the stress on the free layer. As shown in FIG. 8A, the magnetic moment 222A is canted by angle θ from the easy axis. As discussed above, θ is at least five degrees. The magnetic moment 222A thus has a component 226 in the x-y plane (perpendicular to the easy axis). The arrow 224 indicates the direction of the moments of the spin polarized current. As can be seen from a comparison of 224 and 226, the magnetic moment 222A is no longer at a stagnation point. FIG. 8B depicts another embodiment of the magnetic moment 222B. In this case, the magnetic moment 222B is in-plane because of the reduction in PMA. The component 226' of the magnetic moment 222B that is in-plane is thus the same as the moment 226'. Again, arrow 224 indicates the direction of the moments of the spin polarized current. As can be seen from a comparison of 224 and 226', the magnetic moment 222B is no longer at a stagnation point.

Figure 9:
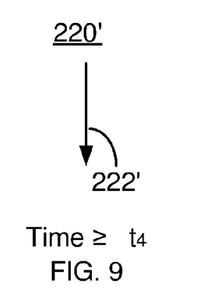

Because of the decrease in the magnetic anisotropy, the magnetic moment 222 is not at the stagnation point for the STT 224. Consequently, the spin polarized current 224 still being driven through the magnetic junction 110 may exert a torque on the magnetic moment 22A/22B. Spin transfer switching due to the write current 212 continues. Because the oscillating magnetic signal perturbed the magnetic moment 242' from the easy axis 241 (away from the stagnation point), the spin transfer switching may be more efficient. Thus, as is shown in FIG. 9, the magnetic moment 222' of the free layer 120 may be switched.

Thus, using the method 200, the free layer 120 of the magnetic junction 110 may be rapidly programmed at lower write currents. When not being written, the free layer magnetic moment 121/222 may be thermally stable due to the high magnetic anisotropy. Thus, the benefits of the magnetic junction 100 may be achieved.

The method 200 may also be explained in connection with FIGS. 10-13. FIGS. 10-13 depict other exemplary embodiments of timing diagrams for programming a magnetic junction 100 using spin transfer torque and a magnetoelastic free layer 120 in the method 200. For simplicity, FIGS. 10-13 are described in the context of the method 200 and magnetic junction 100. However, the discussion herein applies to other analogous methods and magnetic memories. Note that the diagrams of FIGS. 10-13 are for explanation only and are not intended to depict a particular write mechanism or memory. The timing diagrams indicated in FIGS. 10-13 may facilitate more reliable writing.

Figure 10:
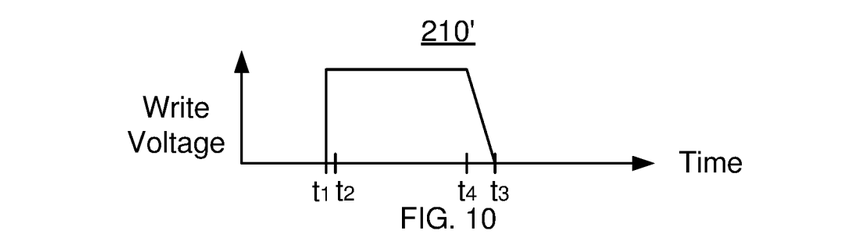
FIGS. 10-13 depict additional exemplary embodiments of timing diagrams for programming a magnetic junction using spin transfer torque and the magnetoelastic effect.

FIG. 10 is a graph 210' depicting the programming voltage through selected magnetic junction 100 as a function of time. Thus, the programming voltage is turned on at time $t_1$, via step 202. The programming voltage is rapidly ramped up, reaching a maximum at time $t_2$. The programming voltage remains constant for a time. The programming voltage is then more slowly ramped down, starting at time $t_4$ and reaching zero at time $t_3$. In addition to a programming voltage being applied to the magnetic junction 100, a write current corresponding to the programming voltage pulse is driven through the magnetic junction 100. Although not shown, the write current and programming voltage may overshoot the desired value in addition to having a fast rise time.

Figure 11:
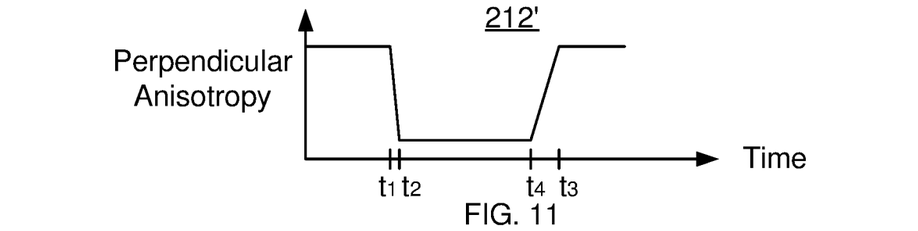

FIG. 11 is a graph 212' depicting the PMA for the free layer 120 as a function of time. The PMA of FIG. 11 is intended to illustrate general trends in the PMA during writing and does not represent data for a specific magnetic junction 100. The saturation magnetization follows similar trends. The free layer 120 is subject to a stress due to the insulating layer(s) 110 and/or 130. The stress is turned on at time $t_1$. The PMA of the free layer 120 decreases. The change in the stress on and PMA of the free layer 120 is rapid. Thus, at time $t_2$, the PMA may be at or close to the minimum value during writing. The PMA remains relatively low during writing because the free layer voltage is still applied. In addition, the spin polarized current is driven through the magnetic junction 100. When the programming voltage starts to be turned off at time $t_4$. The PMA begins to increase and reaches its equilibrium value at time $t_3$, the PMA and saturation magnetization rapidly increase to their initial values.

Figure 12:
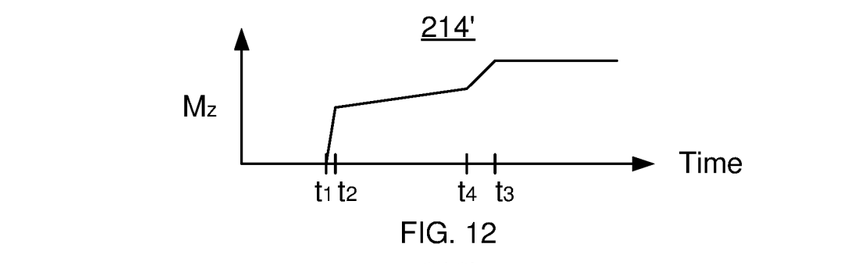

FIG. 12 is a graph 214' depicting changes in the magnetic moment in the desired direction along the z-axis during switching. After the initial reduction in PMA and the attendant decrease in saturation magnetization, the magnetic moment 121 may be switched using STT. This may occur rapidly because the reduction in PMA has moved the magnetic moment 121 away from the stagnation point. In some embodiments, the magnetic moments may be switched with acceptably small error rates in less than five nanoseconds. In some embodiments, such switching takes at least one nanosecond. However, other times are possible.

Figure 13:
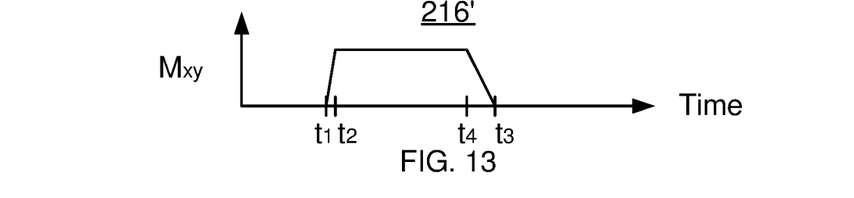

FIG. 13 is a graph 216' depicting the component of the magnetic moment 121 in the x-y plane (in-plane). Prior to switching, the magnetic moment 121 is substantially perpendicular-to-plane. Thus, the magnetic moment 121 in the x-y plane (Mxy) is near zero. The reduction in the PMA due to the applied programming voltage allows for a nonzero component of the magnetic moment 121 in the x-y plane. As can be seen in FIG. 13, this change in the magnetic moment may occur relatively rapidly. In some embodiments, Mxy becomes large. This occurs if the reduction in PMA allows the magnetic moment 121 to go in-plane or be canted at a very large angle from the z-axis. When the programming voltage is removed with the slope of FIG. 10, the component of the magnetic moment 121 in the x-y plane decreases slowly. This allows the magnetic moment 121 of the free layer 120 to remain more stable at the end of programming. Thus, fewer errors due to thermal and other instabilities are likely to be introduced. As a result, programming of the magnetic junction 100 using the timing diagrams of FIGS. 10-13 may be more likely to be error free. Consequently, by allowing the programming voltage to decrease more slowly at the trailing edge of the pulse, lower error rate writing may be achieved.

Figure 14:
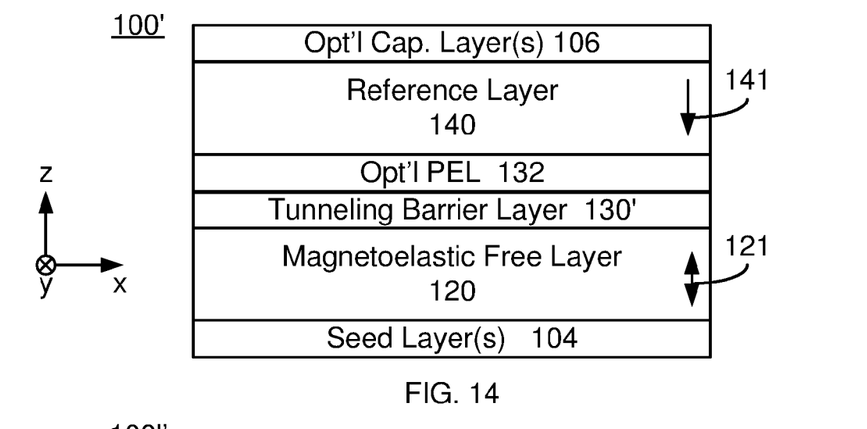
FIG. 14 depicts another exemplary embodiment of a magnetic junction programmable using spin transfer and the magnetoelastic effect.

FIG. 14 depicts another exemplary embodiment of a magnetic junction 100' including a magnetoelastic free layer that is usable in a magnetic memory programmable using spin transfer torque. For clarity, FIG. 14 is not to scale. The magnetic junction 100' may be used in a magnetic device such as a STT-RAM and, therefore, in a variety of electronic devices. The magnetic junction 100' is analogous to the magnetic junction 100. As a result, similar components have similar labels. The magnetic junction 100' includes a magnetoelastic free layer 120 having magnetic moment 121, a nonmagnetic spacer layer 130' and a reference layer 140 having magnetic moment 141 that are analogous to the free layer 120 having magnetic moment 121, the nonmagnetic spacer layer 130 and the reference layer 140 having magnetic moment 141, respectively, depicted in FIG. 1. Also shown are optional seed layer(s) 104, optional capping layer(s) 106, and optional PEL 132. Although not shown, an underlying substrate, bottom contact and top contact are analogous to the substrate 101, bottom contact 102 and top contact 108 shown in FIG. 1 might be included. In addition, one or more additional PELs (not shown) may be present. In addition, although it appears as though the free layer 120 would be closest to the substrate (not shown in FIG. 14) and the reference layer 140 furthest from the substrate, other relationships may be possible. For example, the reference layer 140 may be closest to the substrate and the free layer 120 may be furthest from the substrate.

In the embodiment shown in FIG. 14, the nonmagnetic spacer layer 130' is explicitly insulating. Thus the nonmagnetic spacer layer 130' may be an insulating tunneling barrier layer, such as crystalline MgO having a (200) orientation. Also in the embodiment shown, the insulating layer 110 is omitted.

The magnetic junction 100' shares the benefits of the magnetic junction 100. Because the free layer 120 is magnetoelastic/has a magnetostriction as described above, switching is facilitated. More specifically, a programming voltage applied for the magnetic junction 100' results in the magnetic moment 121 being canted away from the stagnation point. In some embodiments, the magnetic moment 121 may go in-plane due to the change in the PMA of the free layer 120 under the influence of a stress. The saturation magnetization may also be decreased. As a result, switching may be accomplished more rapidly. With engineering of the shape of the programming voltage pulse, reduced error switching may be achieved. Thus, switching time and reliability of programming may be improved.

Figure 15:
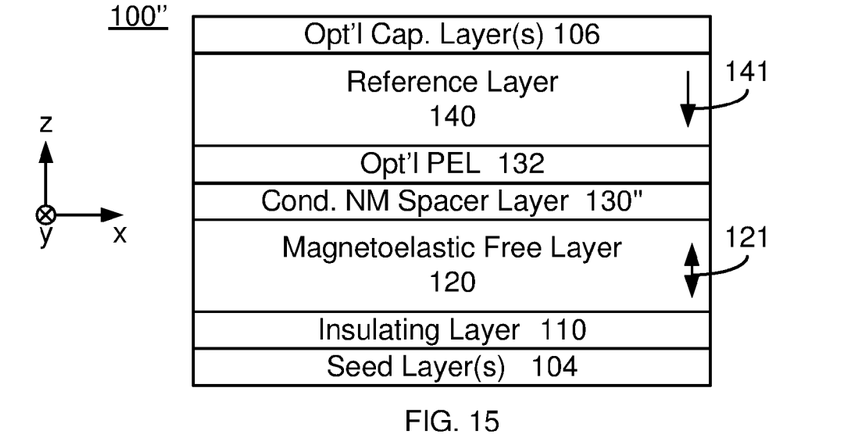
FIG. 15 depicts another exemplary embodiment of a magnetic junction programmable using spin transfer and the magnetoelastic effect.

FIG. 15 depicts another exemplary embodiment of a magnetic junction 100" including a magnetoelastic free layer that is usable in a magnetic memory programmable using spin transfer torque. For clarity, FIG. 15 is not to scale. The magnetic junction 100" may be used in a magnetic device such as a STT-RAM and, therefore, in a variety of electronic devices. The magnetic junction 100" is analogous to the magnetic junction(s) 100 and/or 100'. As a result, similar components have similar labels. The magnetic junction 100' includes an insulating layer 110, magnetoelastic free layer 120 having magnetic moment 121, a nonmagnetic spacer layer 130" and a reference layer 140 having magnetic moment 141 that are analogous to insulating layer 110, the free layer 120 having magnetic moment 121, the nonmagnetic spacer layer 130 and the reference layer 140 having magnetic moment 141, respectively, depicted in FIG. 1. Also shown are optional seed layer(s) 104, optional capping layer(s) 106, and optional PEL 132. Although not shown, an underlying substrate, bottom contact and top contact are analogous to the substrate 101, bottom contact 102 and top contact 108 shown in FIG. 1 might be included. In addition, one or more additional PELs (not shown) may be present. In addition, although it appears as though the magnetic junction 100" is a top pinned magnetic junction, in other embodiments the magnetic junction 100" may be a bottom pinned magnetic junction.

In the embodiment shown in FIG. 15, the nonmagnetic spacer layer 130" is explicitly conductive, or metallic. In addition, the insulating layer 110 is included. Thus, the free layer 120 adjoins at least one insulating layer. The insulating layer 110 may be a tunneling barrier layer, such as crystalline MgO having a (200) orientation.

The magnetic junction 100" shares the benefits of the magnetic junctions 100 and/or 100'. Because the free layer 120 is magnetoelastic/has a magnetostriction as described above, switching is facilitated. More specifically, a programming voltage applied for the magnetic junction 100" results in the magnetic moment 121 that is not at the stagnation point. The saturation magnetization may also be decreased. As a result, switching may be accomplished more rapidly. With engineering of the shape of the programming voltage pulse, reduced error switching may be achieved. Thus, switching time and reliability of programming may be improved.

Figure 16:
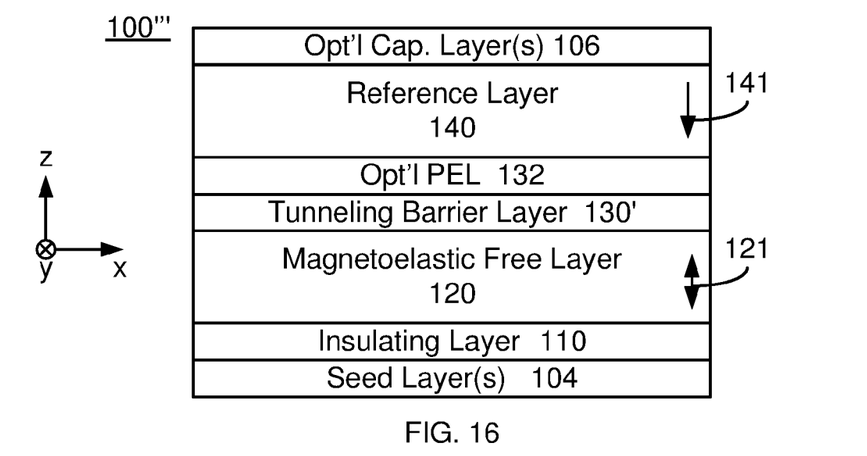
FIG. 16 depicts another exemplary embodiment of a magnetic junction programmable using spin transfer and the magnetoelastic effect.

FIG. 16 depicts another exemplary embodiment of a magnetic junction 100''' including a magnetoelastic free layer that is usable in a magnetic memory programmable using spin transfer torque. For clarity, FIG. 16 is not to scale. The magnetic junction 100''' may be used in a magnetic device such as a STT-RAM and, therefore, in a variety of electronic devices. The magnetic junction 100" is analogous to the magnetic junction(s) 100, 100' and/or 100". As a result, similar components have similar labels. The magnetic junction 100" includes an insulating layer 110, magnetoelastic free layer 120 having magnetic moment 121, a nonmagnetic spacer layer 130' and a reference layer 140 having magnetic moment 141 that are analogous to insulating layer 110, the free layer 120 having magnetic moment 121, the nonmagnetic spacer layer 130 and the reference layer 140 having magnetic moment 141, respectively, depicted in FIG. 1. Also shown are optional seed layer(s) 104, optional capping layer(s) 106, and optional PEL 132. Although not shown, an underlying substrate, bottom contact and top contact are analogous to the substrate 101, bottom contact 102 and top contact 108 shown in FIG. 1 might be included. In addition, one or more additional PELs (not shown) may be present. In addition, although it appears as though the magnetic junction 100''' is a top pinned magnetic junction, in other embodiments the magnetic junction 100''' may be a bottom pinned magnetic junction.

In the embodiment shown in FIG. 16, the nonmagnetic spacer layer 130' is an insulating tunneling barrier layer. The nonmagnetic spacer layer 130' may be a layer of crystalline MgO having a (200) orientation. In addition, the insulating layer 110 is included. The insulating layer 110 may also be a tunneling barrier layer, such as crystalline MgO having a (200) orientation. Thus, the free layer 120 adjoins two insulating layers. This situation is desirable for the largest stress and thus the largest change in PMA to be placed on the free layer 120.

The magnetic junction 100''' shares the benefits of the magnetic junctions 100, 100' and/or 100". Because the free layer 120 is magnetoelastic/has a magnetostriction as described above, switching is facilitated. More specifically, a programming voltage applied for the magnetic junction 100''' results in the magnetic moment 121 that is not at the stagnation point. The saturation magnetization may also be decreased. As a result, switching may be accomplished more rapidly. With engineering of the shape of the programming voltage pulse, reduced error switching may be achieved. Thus, switching time and reliability of programming may be improved.

Figure 17:
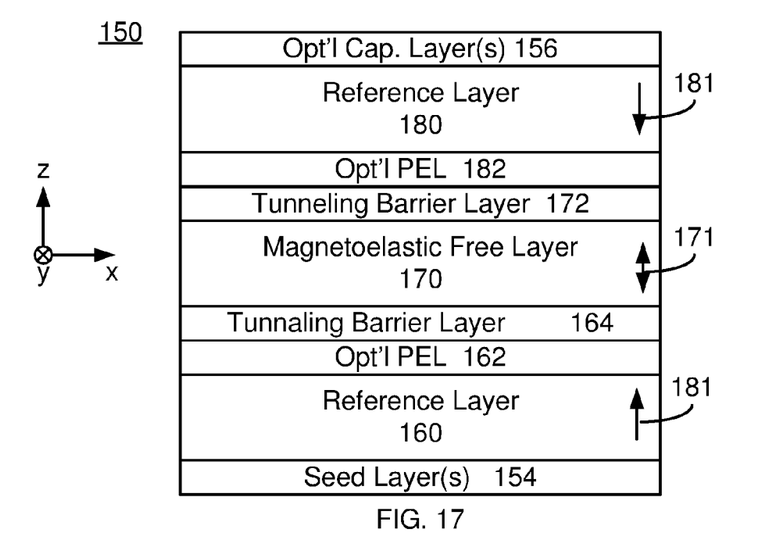
FIG. 17 depicts another exemplary embodiment of a magnetic junction programmable using spin transfer and the magnetoelastic effect.

FIG. 17 depicts another exemplary embodiment of a magnetic junction 150 including a magnetoelastic free layer that is usable in a magnetic memory programmable using spin transfer torque. For clarity, FIG. 17 is not to scale. The magnetic junction 150 may be used in a magnetic device such as a STT-RAM and, therefore, in a variety of electronic devices. The magnetic junction 150 is analogous to the magnetic junction(s) 100, 100', 100" and/or 100'''. As a result, similar components have similar labels. The magnetic junction 150 includes magnetoelastic free layer 170 having magnetic moment 171, a nonmagnetic spacer layer 172 and a reference layer 180 having magnetic moment 181 that are analogous to insulating layer 110, the free layer 120 having magnetic moment 121, the nonmagnetic spacer layer 130 and the reference layer 140 having magnetic moment 141, respectively, depicted in FIG. 1. The magnetic junction 150 also includes an additional reference layer 160 and an additional nonmagnetic spacer layer 164. One or both of the layers 164 and 172 are insulating tunneling barrier layers. For example, the layer 164 may be considered analogous to the layer 110. Also shown are optional seed layer(s) 154, optional capping layer(s) 156, and optional PELS 162 and 172. Although not shown, an underlying substrate, bottom contact and top contact are analogous to the substrate 101, bottom contact 102 and top contact 108 shown in FIG. 1 might be included. In addition, one or more additional PELs (not shown) may be present. The magnetic junction 150 is thus a dual magnetic junction.

In the embodiment shown in FIG. 17, one or both of nonmagnetic spacer layers 164 and 172 are insulating tunneling barrier layers. Thus, the combination of the layers 164, 170 and 172 function in analogous manner to the layers 110, 120 and 130. Consequently, the free layer 170 may undergo an analogous reduction in PMA and saturation magnetization as described above in the presence of a programming voltage.

The magnetic junction 150 shares the benefits of the magnetic junctions 100, 100', 100" and/or 100'''. Because the free layer 170 is magnetoelastic/has a magnetostriction as described above, switching is facilitated. More specifically, a programming voltage applied for the magnetic junction 150 results in the magnetic moment 171 that is not at the stagnation point. The saturation magnetization may also be decreased. As a result, switching may be accomplished more rapidly. With engineering of the shape of the programming voltage pulse, reduced error switching may be achieved. Thus, switching time and reliability of programming may be improved.

Figure 18:
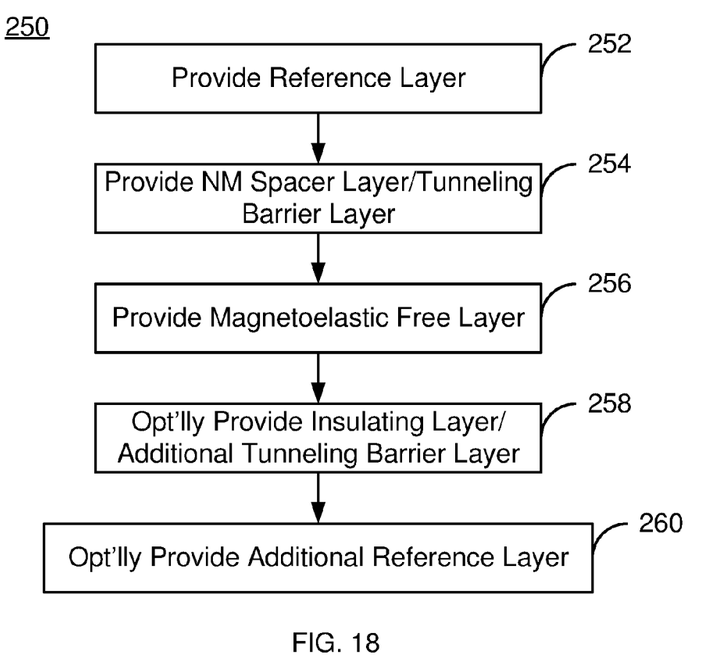
FIG. 18 is a flow chart depicting an exemplary embodiment of a method for providing a magnetic memory programmable using spin transfer torque and the magnetoelastic effect.

FIG. 18 depicts an exemplary embodiment of a method 250 for fabricating a magnetic junction including a magnetoelastic and usable in a magnetic device such as a spin transfer torque random access memory (STT-RAM) and, therefore, in a variety of electronic devices. For simplicity, some steps may be omitted, performed in another order, include substeps and/or combined. Further, the method 250 may start after other steps in forming a magnetic memory have been performed. For simplicity, the method 250 is described in the context of the magnetic junctions 100 and 150. However, other magnetic junctions, including but not limited to the magnetic junction(s) 100', 100" and/or 100'" may be formed.

A reference layer 140/160 that may have its PMA exceeding its out-of-plane demagnetization energy is provided substrate, via step 252. In some embodiments, step 252 may include providing a multilayer such as a SAF, a high PMA multilayer, and/or another multilayer.

A nonmagnetic spacer layer 130/164 is provided, via step 254. Step 254 may include depositing MgO, which forms a tunneling barrier layer. In some embodiments, step 254 may include depositing MgO using, for example, radio frequency (RF) sputtering. In other embodiments, metallic Mg may be deposited, then oxidized in step 254.

A free layer 120/170 is provided, via step 256. The nonmagnetic spacer layer 130/162 is between the reference layer 140/160 and the free layer 120/170. The PMA energy of the free layer 120/170 may be greater than its demagnetization energy at equilibrium (when the magnetic junction 100 is quiescent). Thus, the magnetic moment 121/171 may be perpendicular to plane.

The optional insulating layer 110 may optionally be provided, via step 258. If the magnetic junction 150 is being provided, then step 258 forms the additional nonmagnetic spacer layer 172. One or both of the layers 164 and 174 and one or both of the layers 110 and 130 are insulating tunneling barrier layers. Step 258 may be omitted for the magnetic junction 100.

An additional reference layer 180 that may have its PMA exceeding its out-of-plane demagnetization energy may optionally be provided, via step 260. The nonmagnetic spacer layer 172 is between the reference layer 180 and the free layer 170. In some embodiments, step 260 may include providing a multilayer such as a SAF, a high PMA multilayer, and/or another multilayer.

In some embodiments steps 258 is performed before 256; step 256 is performed before step 254; and step 254 is performed before step 252. However, other orders are possible. For example, the order of steps may be 252, 254, 256, 258 (if performed) and 260 (if performed) as shown.

Fabrication of the magnetic junction 100/150 may be completed. This may include substeps interleaved with the remaining steps. For example, completing the magnetic junction 100/150 may include providing one or more PELs. One or more anneals may also be carried out during fabrication. In addition, the edges of the magnetic junction 100/150 may be defined. For example, a mask may be provided on the stack of layers for the magnetic junction 100/150. The mask covers region(s) to be formed into magnetic junctions 100 and has apertures over regions between the magnetic junctions. An ion mill may then be performed. The regions between the magnetic junctions may be refilled and/or other structures formed. Thus, fabrication of the magnetic junction is completed.

Using the method 250, the magnetic junction 100', 100", 100'", and/or 150 may be formed. Thus, the benefits of the magnetic junction(s) 100', 100", 100'", and/or 150 may be achieved.

Figure 19:
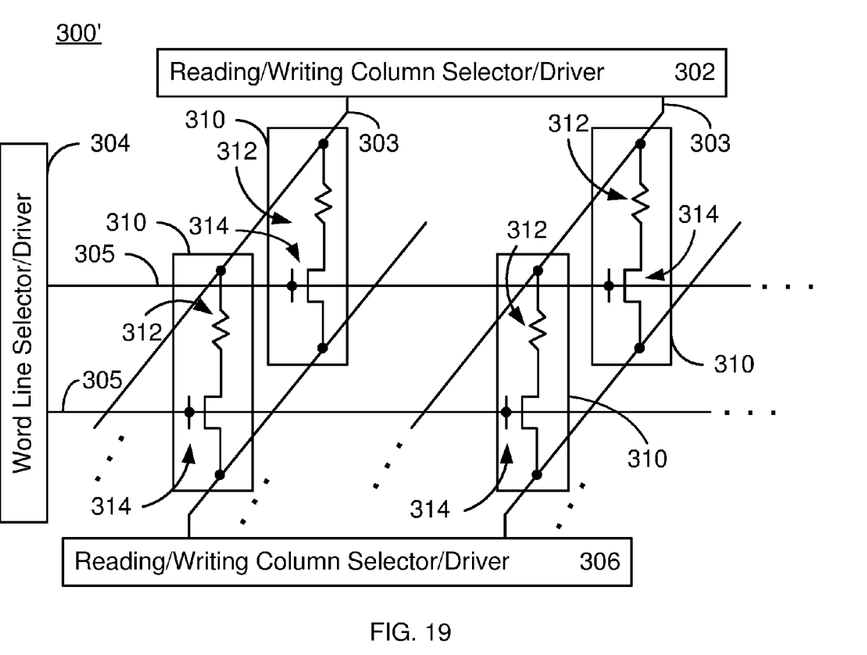
FIG. 19 depicts another exemplary embodiment of a magnetic device including magnetic junctions programmable using spin transfer and the magnetoelastic effect.

FIG. 19 depicts an exemplary embodiment of a memory 300 that may use one or more of the magnetic junctions 100, 100', 100", 100'" and/or 150 that are programmed by the method 200. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 100, 100', 100", 100'" and/or 150 disclosed herein. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

I claim:

1. A magnetic junction residing on a substrate and usable in a magnetic device comprising:
a reference layer;
a nonmagnetic spacer layer; and
a free layer, the nonmagnetic spacer layer residing between reference layer and the free layer, the free layer having a magnetic moment, a perpendicular magnetic anisotropy and an out-of-plane demagnetization energy, the perpendicular magnetic anisotropy exceeding the out-of-plane demagnetization energy for a quiescent state, the magnetic moment being along a direction in the quiescent state, the free layer having a magnetostriction such that the perpendicular magnetic anisotropy changes so that the magnetic moment is canted by at least five degrees from the direction in the presence of a programming voltage applied for the magnetic junction, the programming voltage being at least 0.1 volts and not more than 2 volts, free layer having a first interface facing the nonmagnetic spacer layer and a second interface opposite to the nonmagnetic spacer layer;
wherein at least one of the nonmagnetic spacer layer is an insulating tunneling barrier layer adjacent to the first interface and the magnetic junction further includes an additional insulating layer adjacent to the second interface;
wherein the magnetic junction is configured such that the free layer is switchable between a plurality of stable magnetic states when a write current is passed through the magnetic junction.

2. The magnetic junction of claim 1 wherein the direction is perpendicular-to-plane.

3. The magnetic junction of claim 1 wherein the nonmagnetic spacer layer is the insulating tunneling barrier layer and the magnetic junction includes the nonmagnetic insulating layer.

4. The magnetic junction of claim 3 wherein the nonmagnetic insulating layer is an additional tunneling barrier layer and wherein the magnetic junction further includes:
an additional reference layer, the additional tunneling barrier layer being between free layer and the additional reference layer.

5. The magnetic junction of claim 1 wherein the free layer includes at least one of a Tb alloy, a Co alloy and $Tb_xDy_{1-x}Fe_2$, where x is greater than zero and less than one.

6. The magnetic junction of claim 1 wherein the programming voltage is at least 0.5 volt and not more than one volt.

7. The magnetic junction of claim 1 wherein the nonmagnetic spacer layer is a conductor and wherein the magnetic junction includes the additional insulating layer.

8. The magnetic junction of claim 1 wherein the nonmagnetic spacer layer is the tunneling barrier layer and adjoins the first interface of the free layer.

9. The magnetic junction of claim 1 wherein the magnetic junction includes the additional insulating layer and wherein the additional insulating layer adjoins the second interface of the free layer.

10. A magnetic memory comprising:
a plurality of magnetic storage cells, each of the plurality of magnetic storage cells including at least one magnetic junction, the at least one magnetic junction including a reference layer, a nonmagnetic spacer layer and a free layer, the nonmagnetic spacer layer residing between reference layer and the free layer, the free layer having a magnetic moment, a perpendicular magnetic anisotropy and an out-of-plane demagnetization energy, the perpendicular magnetic anisotropy exceeding the out-of-plane demagnetization energy for a quiescent state, the magnetic moment being along a direction in the quiescent state, the free layer having a magnetostriction such that the perpendicular magnetic anisotropy changes so that the magnetic moment is canted by at least five degrees from the direction in the presence of a programming voltage applied for the magnetic junction, the programming voltage being at least 0.1 volts and not more than 2 volts, free layer having a first interface facing the nonmagnetic spacer layer and a second interface opposite to the nonmagnetic spacer layer, the magnetic junction being configured such that the free layer is switchable between a plurality of stable magnetic states when a write current is passed through the magnetic junction, at least one of the nonmagnetic spacer layer being an insulating tunneling barrier layer adjacent to the first interface and the magnetic junction further including an additional insulating layer adjacent to the second interface;
a plurality of bit lines coupled with the plurality of magnetic storage cells.

11. The magnetic memory of claim 10 wherein the direction is perpendicular-to-plane.

12. The magnetic memory of claim 10 wherein the nonmagnetic spacer layer is the insulating tunneling barrier layer and the magnetic junction includes the nonmagnetic insulating layer.

13. The magnetic memory of claim 12 wherein the nonmagnetic insulating layer is an additional tunneling barrier layer and wherein the magnetic junction further includes:
an additional pinned layer, the additional tunneling barrier layer being between free layer and the additional pinned layer.

14. The magnetic memory of claim 12 wherein the free layer includes at least one of a Tb alloy, a Co alloys and $Tb_xDy_{1-x}Fe_2$, where x is greater than zero and less than one.

15. The magnetic memory of claim 10 wherein the programming voltage is at least 0.5 volt and not more than one volt.

16. A method for programming a magnetic junction including a free layer, a nonmagnetic spacer layer and a reference layer, the nonmagnetic spacer layer residing between reference layer and the free layer, the magnetic junction being configured such that the free layer is switchable between a plurality of stable magnetic states when a write current is passed through the magnetic junction, the method comprising:
driving the write current through the magnetic junction by applying a programming voltage for the magnetic junction, the free layer having a magnetic moment, a perpendicular magnetic anisotropy and an out-of-plane demagnetization energy, the perpendicular magnetic anisotropy exceeding the out-of-plane demagnetization energy for a quiescent state, the magnetic moment being along a direction in the quiescent state, the free layer having a magnetostriction such that the perpendicular magnetic anisotropy changes so that the magnetic moment is canted by at least five degrees from the direction in the presence of the programming voltage applied for the magnetic junction, the programming voltage being at least 0.1 volts and not more than 2 volts, free layer having a first interface facing the nonmagnetic spacer layer and a second interface opposite to the nonmagnetic spacer layer, at least one of the nonmagnetic spacer layer being an insulating tunneling barrier layer adjacent to the first interface and the magnetic junction further including an additional insulating layer adjacent to the second interface.

17. The method of claim 16 wherein the step of driving the write current further includes:
providing a voltage pulse having a leading edge and a trailing edge, the trailing edge having a finite slope in a voltage versus time domain.

18. The magnetic junction of claim 1 wherein the nonmagnetic spacer layer is the insulating tunneling barrier layer and adjoins the free layer.

* * * * *